United States Patent [19]

Kurihara et al.

[11] 4,151,502
[45] Apr. 24, 1979

[54] SEMICONDUCTOR TRANSDUCER

[75] Inventors: Yasutoshi Kurihara, Katsuta; Tetuo Kosugi, Ibaraki; Teruyuki Kagami, Hitachiota; Satoshi Shimada, Hitachi; Yasumasa Matsuda, Hitachi; Kazuji Yamada, Hitachi, all of Japan

[73] Assignee: Hitachi, Ltd., Japan

[21] Appl. No.: 787,841

[22] Filed: Apr. 15, 1977

[30] Foreign Application Priority Data

Apr. 19, 1976 [JP] Japan .................................... 51-43581

[51] Int. Cl.² ............................................ G01B 11/16
[52] U.S. Cl. ................................ 338/2; 29/610 SG; 73/DIG. 4; 73/777, 781; 338/5; 338/5; 338/13
[58] Field of Search .............................. 338/2, 5, 13; 29/610 SG; 73/DIG. 4, 88.5 SD

[56] References Cited

U.S. PATENT DOCUMENTS

| 3,451,030 | 6/1969 | Garfinkel | 338/2 |
| 3,458,345 | 7/1969 | Fenner | 338/2 X |
| 3,753,196 | 8/1973 | Kurtz et al. | 338/5 X |
| 3,913,391 | 10/1975 | Kurtz | 73/88.5 SD |
| 3,922,705 | 11/1975 | Yerman | 338/2 X |
| 4,019,388 | 4/1977 | Hall | 73/88.5 SD |
| 4,047,144 | 9/1977 | Wong | 338/2 |

FOREIGN PATENT DOCUMENTS 923153  4/1963  United Kingdom ............... 73/88.5 SD

*Primary Examiner*—Richard R. Kucia
*Attorney, Agent, or Firm*—Craig & Antonelli

[57] ABSTRACT

A semiconductor transducer comprises a semiconductor strain gauge composed of a mono-crystalline semiconducting material and a strain sensing region formed in a first main surface of the mono-crystalline semiconducting material, and a strain measuring member coupled to the semiconductor strain gauge through an alloy material. An electrical insulating layer is attached to a second main surface of the mono-crystalline semiconducting material which is coupled to the strain measuring member through the alloy material. The insulating layer is extended to a side surface of the mono-crystalline semiconducting material thereby to cover the same side.

12 Claims, 9 Drawing Figures

SEMICONDUCTOR TRANSDUCER

FIELD OF THE INVENTION

This invention relates to a semiconductor transducer, or more in particular to an improvement in the semiconductor transducer using a mono-crystalline semiconducting material.

PRIOR ART OF THE INVENTION

Figure 1:
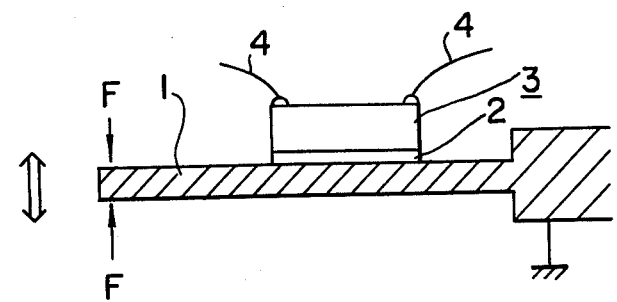
FIG. 1 is a diagram for explaining a general construction of a semiconductor transducer.

It is known that a semiconductor crystal with a specific direction of crystal axis has a piezoelectric resistance. This piezoelectric resistance is a unique nature of the semiconductor and, as well known, is capable of being used to produce a strain gauge which is much superior to the one composed of a metallic material. A semiconductor transducer using this semiconductor crystal will be described with reference to FIG. 1. In this drawing, a semiconductor strain gauge 3 is secured by a bonding material 2 to the upper surface of a strain measuring member 1 which may be a cantilever and displaced when force F is applied to a portion of thereof. This force F is proportional to a change of pressure to be measured of fluid substance or to a displacement to be measured of any other object than the member 1 and is transmitted by a suitable means (not shown) to the portion of the number 1. The semiconductor strain gauge 3 is connected with lead wires 4 leading to an external electrical circuit. The semiconductor strain gauge 3 is composed of a mono-crystalline semiconducting material. Accordingly, this semiconductor transducer operates such that the strain caused by the displacement of the strain measuring member 1 due to the force F reaches the semiconductor strain gauge 3 through the bonding material 2, and an electrical output corresponding to the amount of strain thus transmitted is produced at the external electrical circuit through the lead wires 4. In this case, the semiconductor strain gauge 3 is insulated electrically from the strain measuring member 1 in order to isolate it from various induction noises on one hand and the strain measuring member 1 is grounded on the other hand. If this construction is to be effective for operation of a semiconductor transducer, it is necessary both to securely fasten the semiconductor strain gauge 3 to the strain measuring member 1 and to electrically insulate them from each other.

The meet these requirements, the conventional semiconductor transducer employs various methods wherein (1) the semiconductor strain gauge 3 is bonded with the strain measuring member 1 by means of an organic resin such as epoxy resin, acrylate resin, or the like, (2) a PN junction is formed within the semiconductor strain gauge 3 and used to electrically isolate the semiconductor strain sensing region and the strain measuring member from each other, or (3) the semiconductor strain gauge is bonded with the strain measuring member by means of a glass material. In the method (1), the layer of the bonding material becomes so considerably thick that the displacement of the strain measuring member 1 fails to be accurately transmitted to the semiconductor strain gauge 3. The result is a reduced sensitivity of the strain gauge 3, which, in combination with a reduced heat-resistance of the resin itself, undesirably develops such a creepage phenomenon that the amount of strain can not correctly be transmitted so that the output of the strain gauge is not proportional to the strain amount. In other words, from the inherent nature of resin, it is difficult to attain a strong bonding between the semiconductor strain gauge 3 and the strain measuring member 1 by means of such an organic resin. According to the method (2), on the other hand, as British Patent Specification No. 923,153 describes, it is possible to bond the semiconductor strain gauge 3, by an ordinary alloying treatment, directly to the member the strain of which is to be measured. In addition, the thickness of the alloy layer may be reduced to a considerable degree, thereby enabling accurate transmission of a strain to the semiconductor strain gauge 3. In spite of this, the disadvantage is that the PN junction is unable to function as an insulation barrier against a potential when a forward voltage is applied to the PN junction. Further, thermally-generated carriers unavoidably reduce the insulation property in a high-temperature environment. In the method (3), although complete insulation between the semiconductor strain gauge and the strain measuring member may be attained, there is a disadvantage of extreme difficulty of assuring complete bonding between the semiconductor and the glass material, which is caused by great brittleness of the glass material as well as the difficulty of finding a glass material identical to the semiconductor in the coefficientof thermal expansion, thus making it difficult to industrially produce a semiconductor transducer with stable characteristics.

SUMMARY OF THE INVENTION

An object of the present invention is to obviate the above-mentioned disadvantages and to provide a semiconductor transducer with the semiconductor strain gauge and the strain measuring member completely insulated from each other electrically.

According to the present invention, there is provided, in order to achieve the aforementioned object, a semiconductor transducer comprising a semiconductor strain gauge composed of a mono-crystalline semiconducting material and a strain sensing region formed in a surface of the mono-crystalline semiconducting material, and a strain measuring member bonded to the semiconductor strain gauge through an alloy material, wherein an electrical insulating layer is attached to the interface of the mono-crystalline semiconducting material which is to be bonded to the strain measuring member through the alloy material, the insulating layer being extended to a side of the mono-crystalline semiconducting material to cover the side surface of the mono-crystalline semiconducting material.

DESCRIPTION OF THE PREFERRED EMBODIMENTS

Figure 2:
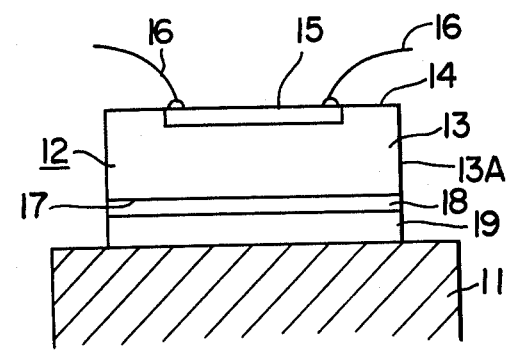
FIG. 2 is a diagram for explaining the concept of a semiconductor transducer according to the present invention.

With those facts as a background, a new method which is the result of development and combination of the advantages of the above-mentioned methods (2) and (3) is considered. FIG. 2 shows a semiconductor transducer obtained by such a new method. In the drawing under consideration, the semiconductor transducer includes a strain measuring member 11 and a semiconductor strain gauge 12. The semiconductor strain gauge 12 is constructed by a mono-crystalline semiconducting material 13 and a strain sensing region 15 formed in a first main surface 14 of the mono-crystalline semiconducting material 13. Lead wires 16 are attached to the strain sensing region 15 for connection with an external electrical circuit. An electrically insulating oxide 18 is attached to a second main surface 17 of the mono-crystalline semiconducting material 13. The semiconductor strain gauge 12 and the strain measuring member 11 thus formed are integrated with each other by means of an alloy material 19, thereby making up a semiconductor transducer. In this semiconductor transducer, the insulating oxide 18 is rendered as thin as approximately 1 μm in order to reduce the residual strain of the strain sensing region 13 on one hand and to lessen the reduction in bonding strength attributable to the difference in the coefficient of thermal expansion between the semiconducting material 13 and the insulating oxide 18 on the other hand. According to this method, the semiconductor strain gauge 12 is integrated with the strain measuring member 11 through the alloy material 19 by thermocompression bonding. The inventors have found that, in the process of this integration, partly because of the thinness of the insulating oxide 18, the alloy material 19 is melted, flows out of the bonded interface and is brought into contact with the side 13A of the mono-crystalline semiconducting material 13. As a result, the mono-crystalline semiconducting material 13 is undesirably liable to electrically conduct with the strain measuring member 11.

Figure 3:
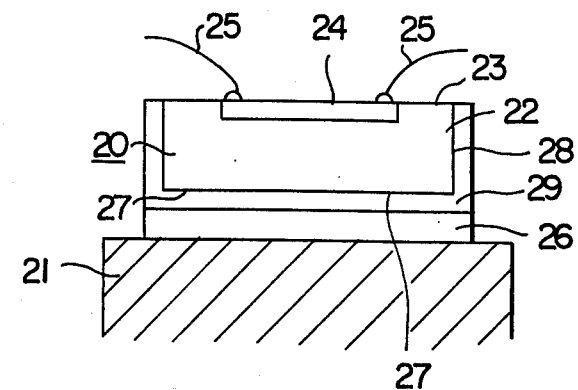
FIG. 3 is a diagram for explaining an embodiment of a semiconductor transducer according to the present invention.

The inventors perceived that such a drawback might be obviated by extending the insulating layer 18 to cover the side surface 13A of the semiconducting material 13. FIG. 3 shows a basic construction of an embodiment transducer according to the present invention. The semiconductor transducer comprises a semiconductor strain gauge 20 and a strain measuring member 21. The semiconductor strain gauge 20 is composed of a mono-crystalline semiconducting material 22 and a strain sensing region 24 formed in a first main surface 23 of the mono-crystalline semiconducting material 22 and has lead wires 25 for connection with an external electrical circuit. This semiconductor strain gauge 20 is coupled to the strain measuring member 21 through an alloy material 26. An insulating layer 29 made of an electrically insulating material is covered on a second main surface 27 opposite to the first main surface 23 and a side surface 28. In other words, the semiconductor transducer according to the present invention is such that the insulating layer 29 is extended to the side surface 28 of the mono-crystalline semiconducting material 20 to cover it. According to the invention, therefore, sufficient insulation is provided by the insulating layer 29, so that when the semiconductor strain gauge 20 is integrated with the strain measuring member 21 by thermocompression bonding, the alloy material 26 is prevented from being brought into electrical contact with the mono-crystalline semiconducting material 22 even if the alloy material 26 is melted and flows out of the bonded area. It is thus possible to provide a reliable semiconductor transducer.

The insulating layer 29 need not necessarily cover the entire side surface 28 but only to the extent enabling sufficient insulation. By contrast, the insulating layer 29 may be so extended as to cover even the portion of the first main surface 23 of the mono-crystalline semiconducting material 22 which is free from the strain sensing region 24 to assure an increased insulation property.

Specific examples of the present invention will be described below.

EXAMPLE 1

Figure 4:
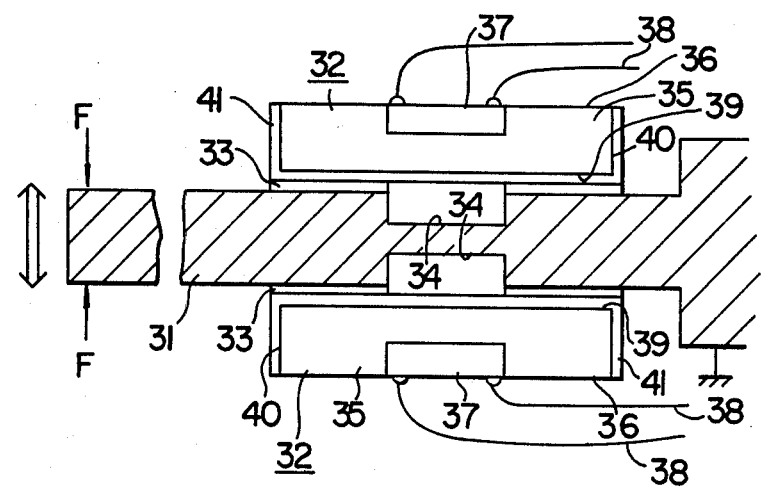
FIG. 4 is a diagram for explaining another embodiment of a semiconductor transducer according to the present invention.

A semiconductor transducer using a silicon mono-crystal is shown in FIG. 4. In this drawing, the semiconductor transducer according to the present invention comprises a couple of semiconductor strain gauges 32 of the type shown in FIG. 3, which are integrally secured to both sides of a strain measuring member 31 through alloy materials 33. The strain measuring member 31 was of the cantilever type and recesses 34 were formed in order to concentrate displacement thereto. The left or free end of the cantilever member 31 may be moved up or down when force F is applied thereto. In this embodiment, an iron-nickel-cobalt group alloy is used for the strain measuring member 31, while each semiconductor strain gauge 32 is a silicon strain gauge (hereinafter referred to as the silicon strain gauge 32). The mono-crystalline semiconducting material 35 is a silicon mono-crystal with crystal orientation (110), specific resistivity of 10 Ωcm and P type in conductivity. The strain sensing region 27 of the first main surface 36 of the mono-crystalline semiconducting material 35 is diffused with boron by the masked-diffusion process, thereby making up an N-type strain sensing region 37. The strain sensing region 37 has lead wires 38 for connection to an external electrical circuit. The insulating layer 41 formed on the second main surface 39 and the side surface 40 of the mono-crystalline semiconducting material 35 is made of a silicon dioxide film which is formed into the thickness of about 1 μm by spattering. As the alloy material 33 for the bonding purpose, a gold-silicon group alloy material is used.

Figure 5:
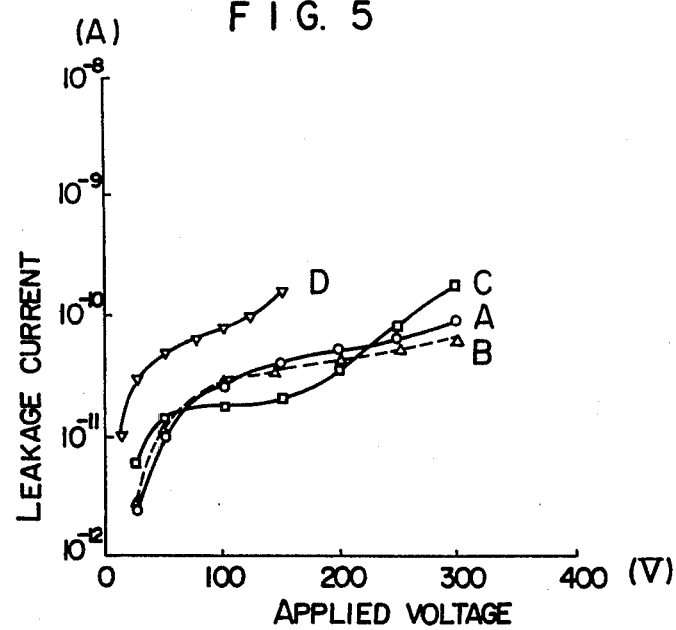
FIG. 5 is a diagram for explaining, by way of example, the insulation characteristics of semiconductor transducers embodying the present invention.
Figure 6:
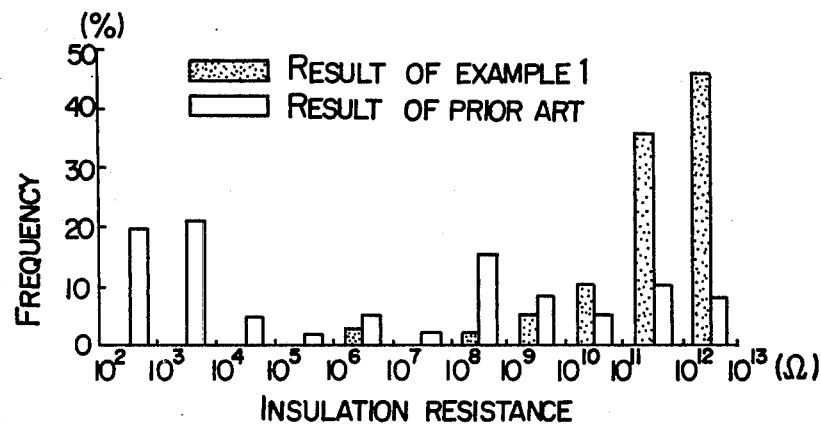
FIG. 6 is a diagram for explaining, by way of example, the distribution of the insulation resistance between the strain sensing region and the strain measuring member of semiconductor transducers embodying the present invention.
Figure 7:
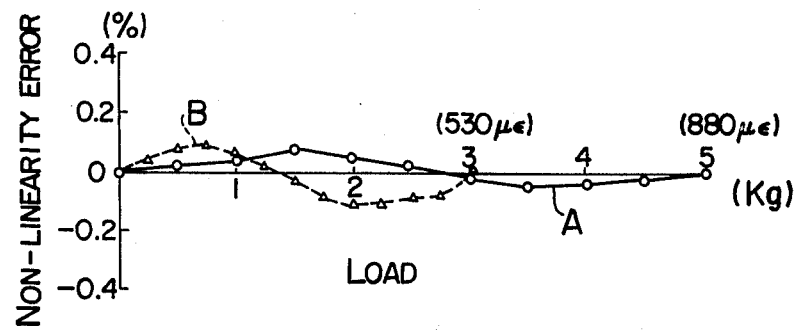
FIG. 7 is a diagram for explaining, by way of example, the output non-linearity error of semiconductor tranducers embodying the present invention.

In the semiconductor transducer with the construction as described above, no crack has been caused in the silicon semiconducting material of the silicon strain gauge 32 before the displacement of the strain measuring member 31 due to force F applied thereto has reached the value of $5000 \times 10^{-6}$ as converted into the amount of strain of the strain sensing region. Thus, good bonding has been achieved between the silicon strain gauge 32 and the strain measuring member 31. In the process, the silicon strain gauge 32 did not come off the strain measuring member 31. It was thus found that the bonding strength between the silicon strain gauge 32 and the strain measuring member 31 in this embodiment was substantially the same as in the prior art alloy bonding process, which bonding strength was sufficiently large for use as a semiconductor transducer. On the other hand, the curve A of FIG. 5 shows the voltage-current characteristics between the strain sensing region 37 and the strain measuring member 13 in FIG. 4. As is obvious from this graph, the leakage current with the applied voltage of 300 V was a very small $10^{-10}$ A or less. Under this condition, the insulating resistance was $3 \times 10^{12}$ Ω or more. Normally, this type of semiconductor transducer is impressed with 25 V at most, in which case the inventors found that the insulating resistance value was $5 \times 10^{12}$ Ω. Thus, the insulation between the silicon strain gauge 32 and the strain measuring member 31 of the present embodiment is sufficient for practical use of the semiconductor transducer. FIG. 6 shows the distribution of insulating resistance between the strain sensing region 32 and the strain measuring member 31 of the semiconductor transducer according to this example. The insulation resistance was $10^{11}$ Ω or higher for 80% of the cases tested, all exceeding $10^6$ Ω. By way of comparison, the insulation resistance of the silicon type semiconductor transducer with the conventional structure was $10^6$ or less for 48% of all cases, only 18% of them exceeding $10^{11}$ Ω. The inventors have thus found that a semiconductor transducer with a high insulating resistance and high yield is obtainable according to the embodiment under consideration, since the silicon strain gauge 32, which is covered with silicon dioxide not only at the bonding surface but at the side surface, is not adversely affected by the bonding gold-silicon group alloy flowing out to the side of the strain gauge 32. Further, the curve A in FIG. 7 shows an output non-linearity error of the semiconductor transducer with the maximum strain range of value $880 \times 10^{-6}$. As clear from this drawing, the nonlinearity error is as small at +0.08 to −0.05%. It will thus be noted that according to this example of the semiconductor transducer, a very small strain remains in the strain gauge after bonding due to the fact that the silicon strain gauge is bonded to the strain measuring member by means of a very thin gold-silicon alloy material. Further, since the strain of the strain measuring member 31 can be accurately transmitted to the strain gauge, the output has a superior linearity.

EXAMPLE 2

In the semiconductor transducer according to this example, an alumina film 0.3 μm thick was formed by spattering in place of the spattered silicon dioxide film in the preceding example for producing the insulating layer 41.

The semiconductor transducer of silicon type having this structure has the bonding strength between the silicon strain gauge 32 and the strain measuring member 31 more than value $5000 \times 10^{-6}$ as converted into the amount of strain of the strain sensing region. The insulation characteristics between the strain sensing region 37 and the strain measuring member 31 had the resistance value of more than $4 \times 10^{12}$ Ω as shown by curve B in FIG. 5, and more than 90% of the transducers produced had the insulation resistance of more than $10^{11}$ Ω. On the other hand, the output non-linearity error with the maximum strain range of value $880 \times 10^{-6}$ was +0.09 to −0.08%. It is evident that this semiconductor transducer has the characteristics and yield substantially the same as those of Example 1 and thus had a sufficiently high practicability.

EXAMPLE 3

The semiconductor transducer according to this example has the insulating film 41 formed of a silicon nitride film 0.5 μm thick obtained by the CVD process, instead of the spattered silicon dioxide film as in the preceding example. Further, as the alloy material 33, the gold-silicon group alloy material was replaced by a gold-germanium group alloy material.

In the semiconductor transducer with this structure, the bonding strength between the silicon strain gauge 32 and the strain measuring member 31 was more than value $4800 \times 10^{-6}$ as converted into the amount of strain of the strain sensing region 37. As to the insulation characteristics between the strain sensing region 37 and the strain measuring member 31, on the other hand, the resistance value of more than $1.5 \times 10^{12}$ Ω was found as shown in curve C. More than 90% of the transducers produced showed the insulation resistance of more than $10^{11}$ Ω. The output non-linearity error ranged from +0.09 to −0.12% for the maximum strain range of value $880 \times 10^{-6}$. It will be thus understood that this example of the semiconductor transducer has substantially the same characteristics and yield as Example 1 and obviously is sufficiently practicable as a semiconductor transducer.

EXAMPLE 4

According to the semiconductor transducer of this example, the mono-crystalline semiconducting material 35 was made of a silicon mono-crystal of N conduction type with the crystal orientation of (110) and the specific resistivity of 4 Ωcm. This material was diffused with gallium to form the strain sensing region 37 of P conduction type. In producing the insulating layer 41, a silicon dioxide film 0.5 μm thick was first formed by the CVD process and then an alumina film 0.3 μm thick was laid on it by spattering.

The semiconductor transducer thus constructed had the bonding strength between the silicon strain gauge 32 and the strain measuring member 31, which was more than value $5000 \times 10^{-6}$ as converted into the amount of strain of the strain sensing region. More than 95% of the semiconductor transducers produced had the insulation resistance of more than $10^{11}$ Ω between the strain sensing region 37 and the strain measuring member 31. The output non-linearity error with maximum strain range of value $880 \times 10^{-6}$ was found to +0.12 to −0.11%. Also in this case, it is thus obvious that the characteristics and yield of the semiconductor transducer are substantially identical to those of Example 1 mentioned above, and it is sufficiently practicable.

EXAMPLE 5

This example of semiconductor transducer used a mono-crystalline germanium of N conduction type with the crystal orientation (110) and the specific resistivity of 1 Ωcm as the mono-crystalline semiconducting material 35. The mono-crystalline semiconducting material 35 was formed with the strain sensing region 37 of P conduction by masked spattering of gallium. The semiconductor strain gauge 32 composed of this germanium mono-crystal will hereinafter be called the germanium strain gauge 32. As the insulating layer 41, germanium dioxide was deposited by the CVD process, while a gold-germanium group alloy material was used as the alloy material 33. The bonding strength between the germanium strain gauge 32 and the strain measuring member 31 of the semiconductor transducer of germanium type with this construction was more than value $4500 \times 10^{-6}$ as converted into the amount of strain of the strain sensing region 37, while the insulation characteristics between the strain sensing region 37 and the strain measuring member 31 displayed the resistance value of more than $7.5 \times 10^{11}$ Ω as shown by curve D in FIG. 5. More than 93% of all the semiconductor transducers produced showed the insulating resistance value of more than $10^{11}$ Ω. The output non-linearity error with the maximum strain range of value $530 \times 10^{-6}$ was +0.09 to −0.11% as shown by curve B in FIG. 7. The semiconductor transducer according to this example, as compared with the conventional germanium-type semiconductor transducer, was found to have a superior bonding strength, insulating characteristics, and output linearity. Further, industrial production of the semiconductor transducer having such superior characteristics is possible with high yield.

EXAMPLE 6

In the semiconductor transducer of this example, a mono-crystalline germanium of N conduction type with the crystal orientation of (110) and the specific resistivity of 2 Ωcm was used as the monocrystalline semiconducting material of Example 1. The strain sensing region 7 of P conduction type was formed in the monocrystalline semiconducting material 35 by the masked diffusion of gallium. The insulating layer 41 was made of chromium doped gallium arsenide which was formed by dismutation with the chromium doped gallium arsenide as a source. As the alloy material 33, on the other hand, a gold-germanium group alloy material was used.

The germanium-type semiconductor transducer with this structure has the bonding strength, between the germanium strain gauge 32 and the strain measuring member 31, of more than value $4500 \times 10^{-6}$ as converted into the amount of strain of the strain sensing region 37. More than 88% of all of the semiconductor transducers produced by this method had the insulation resistance value of more than $10^{11}$ Ω between the strain sensing region 37 and the strain measuring member 31. The output nonlinearity error with maximum strain range of value $530 \times 10^{-6}$ was found to be +0.17 to −0.17%. It was thus found that according to this example of the semiconductor transducer, a superior bonding strength, insulation resistance and output linearity are obtained as compared with the conventional germanium-type semiconductor transducer, and that, semiconductor transducers with such characteristics were capable of being stably manufactured in industry level.

The above-mentioned examples of semiconductor transducer have the advantages described below.

(1) The semiconductor strain gauge and the strain measuring member may be completely insulated from each other electrically without adversely affecting the bonding strength therebetween.

(2) The advantage of (1) above makes it possible to sufficiently increase the tolerable stress (strain) of the semiconductor transducer, with the result that the range of semiconductor measurable is enlarged and an improved safety factor is attained under repetitive strain, thereby leading to a lengthened service life of the semiconductor transducer.

(3) The advantage of (1) permits the strain measuring member 31 to be grounded as shown in FIG. 4, so that the characteristics of the semiconductor strain gauge 32 is not affected by other induction noises.

(4) The metal layer of the alloy material 33 for securely bonding the semiconductor strain gauge 32 and the strain measuring member 31 to each other is so thin (several microns) and uniform in thickness that the stress or strain applied to the strain measuring member 31 can be accurately transmitted to the semiconductor strain gauge 31, resulting in an improved linearity of the output of the semiconductor transducer against the stress or strain.

(5) Due to the advantages of (1) to (4), it is possible to stably manufacture compact, reliable semiconductor transducers light in weight and simple in construction.

The present invention is not limited to the above-described examples but may be applied with equal effect in the manners as mentioned below.

(1) The insulating material forming the insulating layer 41 may take the form of silicon carbide, chromium oxide, iron oxide, germanium nitride, manganese oxide, gallimum arsenide doped with chromium, iron or oxygen, or gallium phosphide doped with chromium, iron or oxygen.

(2) Further, the insulating material may be constructed as a laminated structure of two or more of the insulating materials described above.

(3) As the strain measuring member 31, a metal of single substance such as nickel, cobalt, molybdenum, tungsten or titanium, or an alloy material including any of these metals may be used.

(4) The recesses 34 are formed, as shown in FIG. 4, in the opposite surfaces of the cantilever member 31 so as to concentrate the strain applied to the member 31 to thereby increase the sensitivity of the semiconductor transducer. However, it is not necessary to form such recesses 34 if such a high sensitivity is not required to the semiconductor transducer. In this case the strain gages 32 may be attached to the opposite flat surfaces of the cantilever member 31 and trouble in production may be saved to a cansiderable extent.

Figure 8:
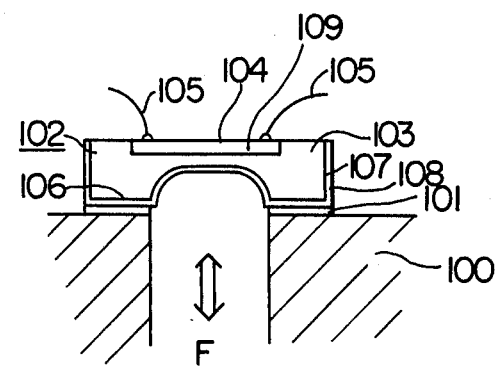
FIG. 8 is a diagram for explaining still another embodiment of a semiconductor transducer according to the invention.

(5) This invention is also applicable to the semiconductor transducer in which the substrate of a mono-crystalline semiconducting material functions both as a strain sensing region and a strain measuring member. An example is shown in FIG. 8. A semiconductor strain gauge 102 is secured to a support 100 by means of an alloy material 101. The semiconductor strain gauge 102, like the one shown in FIG. 3, comprises a monocrystalline semiconducting material 103. In the first main surface 104 of the mono-crystalline semiconducting material 103, formed is a strain sensing region 109 which is connected with lead wires 105, while the second main surface 106 and the side surface 107 of the mono-crystalline semiconducting material 103 are formed with an electrically insulating layer 108 made of an electrically insulating material thereby to improve the insulation characteristics.

Unlike the strain sensing member 31 on which the semiconductor strain gauges 32 are disposed in the embodiment of FIG. 4, the support 100 in this embodiment of FIG. 8 can not be displaced even if a pressure or force F is applied as shown in the drawing but the semiconductor strain gauge 32 per se may be displaced to sense such pressure or force to thereby produce an output from the leads 105 of the strain sensing region 109 in response to the applied pressure or force. The semiconductor transducer of this type is suitable for the purpose of measuring pressure of fluid substance.

It will thus be understood from the foregoing description that according to the present invention it is possible to provide a semiconductor transducer with a semiconductor strain gauge and a strain measuring member completely insulated from each other electrically.

We claim:

1. A semiconductor transducer comprising:
   a semiconductor strain gauge composed of a mono-crystalline semiconducting material portion having a first main surface, a second main surface and a side surface, and a strain sensing region formed in said first main surface of said monocrystalline semiconducting material portion;
   an electrical insulating layer covering said second main surface and said side surface of said monocrystalline semiconducting material portion;
   a strain measuring member at which strain to be sensed is caused; and
   an alloy material interposed between said strain measuring member and that part of said electrical insulating layer which covers said second main surface of said mono-crystalline semiconducting material portion, for coupling said strain measuring member to said second main surface through said insulating layer,
   wherein said electrical insulating layer is a very thin layer having a thickness of only several μm and is made of one material selected from a group consisting of silicon dioxide, alumina, silicon nitride, germanium dioxide, gallium arsenide doped with a selected one of chromium, iron and oxygen and gallium phosphide doped with a selected one of chromium, iron and oxygen, and wherein said alloy material is one selected from a group consisting of a gold-germanium group alloy and a gold-silicon group alloy and is continuously disposed between said electrical insulating layer and said strain measuring member.

2. A semiconductor transducer according to claim 1, in which said insulating layer not only covers both of said second main surface and said side surface completely but extend to said first main surface to cover a part of said first main surface which is free from said strain sensing region.

3. A semiconductor transducer according to claim 2, in which said mono-crystalline semiconducting material portion is made of a material of one conduction type and said strain sensing region is formed by diffusion of a material of the opposite conduction type, thereby isolating said mono-crystalline semiconducting material portion from said strain sensing region by a PN junction.

4. A semiconductor transducer according to claim 3, in which said mono-crystalline semiconducting material portion is made of a silicon mono-crystal of P conduction type, said mono-crystalline semiconducting material portion having said first main surface formed with an N-type strain sensing region by diffusion of boron; and in which said strain measuring member is made of one material selected from a group of single substances consisting of iron, nickel, cobalt, molybdenum, tungsten and titanium and a group of alloys made of at least two materials selected from said group of single substances.

5. A semiconductor transducer according to claim 3, in which said mono-crystalline semiconducting material portion is made of a silicon mono-crystal of P conduction type, said mono-crystalline semiconducting material portion having said first main surface formed with an N-type strain sensing region by diffusion of boron; in which said insulating layer includes a laminated layer structure of at least two materials selected from a group consisting of silicon dioxide, alumina, silicon nitride, germanium dioxide, gallium arsenide doped with selected one of chromium, iron and oxygen, and gallium phosphide doped with selected one of chromium, iron and oxygen; and in which said strain measuring member is made of one material selected from a group of single substances consisting of iron, nickel, cobalt, molybdenum, tungsten and titanium, and a group of alloys made of at least two materials selected from said group of single substances.

6. A semiconductor transducer according to claim 3, in which said mono-crystalline semiconducting material portion is made of selected one of a silicon mono-crystal and germanium mono-crystal of N conduction type, said mono-crystalline semiconducting material portion having the first main surface thereof formed with a P-type strain sensing region by diffusion of gallium; and in which said strain measuring member is made of one material selected from a group of single substances consisting of iron, nickel, cobalt, molybdenum, tungsten and titanium and a group of alloys made of at least two materials selected from said group of single substances.

7. A semiconductor transducer according to claim 3, in which said mono-crystalline semiconducting material portion is made of selected one of a silicon mono-crystal of N conduction type, said mono-crystalline semiconducting material portion having the first main surface thereof formed with a P-type strain sensing region by diffusion of gallium; in which said insulating layer includes a laminated layer structure of at least two materials selected from a group of silicon dioxide, alumina, silicon nitride, germanium dioxide, gallium arsenide doped with selected one of chromium, iron and oxygen, and gallium phosphide doped with selected one of chromium, iron and oxygen; and in which said strain measuring member is made of one material selected from a group of single substances consisting of iron, nickel, cobalt, molybdenum, tungsten and titanium, and group of alloys made of at least two materials selected from said group of single substances.

8. A semiconductor transducer according to claim 3, in which said mono-crystalline semiconducting material portion is made of a selected one of a silicon mono-crystal and germanium mono-crystal of P conduction type, said mono-crystalline semiconducting material portion having the first main surface formed with a N-type strain sensing region by diffusion of phosphorus.

9. A semiconductor transducer according to claim 1, in which said strain measuring member is a cantilever.

10. A semiconductor transducer according to claim 9, in which said cantilever has flat surfaces and said semiconductor strain gauge is coupled to said cantilever at a portion of one of said flat surfaces.

11. A semiconductor transducer according to claim 9, in which recesses are formed at portions of surfaces of said cantilever to concentrate strain thereto when force is applied to a portion of said cantilever and said semiconductor strain gauge is coupled to said cantilever across one of said recesses.

12. A semiconductor transducer according to claim 1, wherein the electrical insulating layer is 1 μm or less in thickness.